United States Patent
Inoue et al.

(10) Patent No.: US 11,605,523 B2
(45) Date of Patent: Mar. 14, 2023

(54) ABERRATION CORRECTOR AND MULTIPLE ELECTRON BEAM IRRADIATION APPARATUS

(71) Applicant: NuFlare Technology, Inc., Yokohama (JP)

(72) Inventors: Kazuhiko Inoue, Yokohama (JP); Munehiro Ogasawara, Hiratsuka (JP)

(73) Assignee: NuFlare Technology, Inc., Yokohama (JP)

( * ) Notice: Subject to any disclaimer, the term of this patent is extended or adjusted under 35 U.S.C. 154(b) by 175 days.

(21) Appl. No.: 16/879,919

(22) Filed: May 21, 2020

(65) Prior Publication Data
US 2020/0395189 A1 Dec. 17, 2020

(30) Foreign Application Priority Data
Jun. 14, 2019 (JP) .................... JP2019-111578

(51) Int. Cl.
*H01J 37/153* (2006.01)
*H01J 37/09* (2006.01)
*H01J 37/141* (2006.01)

(52) U.S. Cl.
CPC .......... *H01J 37/153* (2013.01); *H01J 37/09* (2013.01); *H01J 37/141* (2013.01);
(Continued)

(58) Field of Classification Search
CPC ........ H01J 37/09; H01J 37/141; H01J 37/153; H01J 2237/026; H01J 2237/038;
(Continued)

(56) References Cited

U.S. PATENT DOCUMENTS

| 2018/0031498 A1* | 2/2018 | Shiratsuchi ........ G01N 23/2251 |
| 2019/0341222 A1* | 11/2019 | Hu ...................... H01J 37/1472 |
| 2019/0355547 A1 | 11/2019 | Ando et al. |

FOREIGN PATENT DOCUMENTS

| JP | 7-262953 A | 10/1995 |
| JP | 2005-123264 A | 5/2005 |

(Continued)

OTHER PUBLICATIONS

Korean Office Action dated Feb. 16, 2022 in Korean Patent Application No. 10-2020-0070054 (with English translation), 13 pages.
(Continued)

*Primary Examiner* — David E Smith
(74) *Attorney, Agent, or Firm* — Oblon, McClelland, Maier & Neustadt, L.L.P.

(57) ABSTRACT

Aberration corrector includes a lower electrode substrate to be formed therein with plural first passage holes having a first hole diameter and making multiple electron beams pass therethrough, and to be arranged thereon plural electrode sets each being plural electrodes of four or more poles, surrounding a first passage hole, for each of the plural first passage holes, and an upper electrode substrate above the lower one, to be formed therein with plural second passage holes making multiple electron beams pass therethrough, whose size from the top of the upper electrode substrate to the middle of way to the back side of the upper electrode substrate is a second hole diameter, and whose size from the middle to the back side is a third hole diameter larger than each of the first and second hole diameters, wherein a shield electrode is on inner walls of plural second passage holes.

12 Claims, 15 Drawing Sheets

(52) U.S. Cl.
CPC ... *H01J 2237/026* (2013.01); *H01J 2237/038* (2013.01); *H01J 2237/0453* (2013.01); *H01J 2237/1532* (2013.01); *H01J 2237/1534* (2013.01)

(58) Field of Classification Search
CPC ....... H01J 2237/0453; H01J 2237/1532; H01J 2237/1534
See application file for complete search history.

(56) References Cited

FOREIGN PATENT DOCUMENTS

| | | | | |
|---|---|---|---|---|
| JP | 2009-032691 | A | 2/2009 | |
| JP | 2013-138037 | A | 7/2013 | |
| JP | 2019-186140 | A | 10/2019 | |
| JP | 2019-200983 | A | 11/2019 | |
| KR | 10-2018-0030605 | A | 3/2018 | |
| WO | WO-2018197169 | A1 * | 11/2018 | ............. H01J 37/12 |
| WO | WO 2019/068666 | A1 | 4/2019 | |

OTHER PUBLICATIONS

Combined Taiwanese Office Action and Search Report dated Oct. 5, 2021 in Patent Application No. 109116918 (with English machine translation), 12 pages.
Japanese Office Action dated Jan. 31, 2023, issued in Japanese Patent Application No. 2019-111578 (with English translation).

* cited by examiner

ABERRATION CORRECTOR AND MULTIPLE ELECTRON BEAM IRRADIATION APPARATUS

CROSS-REFERENCE TO RELATED APPLICATION

This application is based upon and claims the benefit of priority from prior Japanese Patent Application No. 2019-111578 filed on Jun. 14, 2019 in Japan, the entire contents of which are incorporated herein by reference.

BACKGROUND OF THE INVENTION

Field of the Invention

Embodiments of the present invention relate to an aberration corrector and a multiple electron beam irradiation apparatus. For example, embodiments of the present invention relate to an apparatus that emits electron multiple beams, and to a multipole lens array that corrects aberration of multiple electron beams.

In recent years, with the advance of high integration and large capacity of Large Scale Integrated circuits (LSI), the line width (critical dimension) required for circuits of semiconductor elements is becoming progressively narrower. Since LSI manufacturing requires a high manufacturing cost, it is crucially essential to improve its yield. However, as typified by a 1-gigabit DRAM (Dynamic Random Access Memory), the scale of patterns configuring an LSI is in transition from on the order of sub-microns to on the order of nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate.

As an inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there are "die-to-die inspection" and "die-to-database inspection". The "die-to-die inspection" method compares data of measured images acquired by imaging the same patterns at different positions on the same substrate. The "die-to-database inspection" method generates, based on pattern design data, design image data (reference image) to be compared with a measured image being measured data acquired by imaging a pattern. Then, acquired images are transmitted as measured data to a comparison circuit. After performing alignment between the images, the comparison circuit compares the measured data with reference data according to an appropriate algorithm, and determines that there is a pattern defect if the compared data do not match with each other.

Specifically with respect to the pattern inspection apparatus described above, in addition to the type of apparatus that irradiates an inspection substrate with laser beams in order to obtain a transmission image or a reflection image of a pattern formed on the substrate, there has been developed another type of inspection apparatus that acquires a pattern image by scanning the inspection substrate with electron beams and detecting secondary electrons emitted from the inspection substrate due to the irradiation with the electron beams. Regarding the inspection apparatus utilizing electron beams, an apparatus using multiple beams has also been under development. In an electron optical system using multiple beams, aberration such as off-axis astigmatism and distortion (distortion aberration) may occur. With the inspection apparatus using electron beams, it is necessary to acquire a highly accurate image in order to perform inspection. In order to correct such an aberration, the trajectory of each of the multiple beams needs to be individually corrected. For example, for correcting a trajectory for the purpose of correcting aberration, there is a method of arranging in an array multipole lenses each of which is for each beam. In order to apply a deflection amount which is just for correcting such an aberration to each electron beam, the thickness of each electrode itself of a multipole lens needs to be about several tens of μm, such as 50 μm. It is difficult in manufacturing process to form an electrode having a thickness of several tens of μm, due to a narrow pitch between beams. Therefore, the thickness of the electrode is desired to be as thin as possible.

Although not being a structure where multipole lenses which individually correct the trajectory of each beam are arranged in an array, there is disclosed an aberration corrector that corrects an off-axis astigmatism by making all the multiple beams pass through the space surrounded by the multipoles (e.g., refer to Japanese Patent Application Laid-open (JP-A) No. 2013-138037).

BRIEF SUMMARY OF THE INVENTION

According to one aspect of the present invention, an aberration corrector includes a lower electrode substrate configured to be formed therein with a plurality of a first passage holes which has a first hole diameter and through which multiple electron beams pass, and to be arranged thereon a plurality of electrode sets each being a plurality of electrodes of four poles or more than four poles, which surround a first passage hole of the plurality of the first passage holes, for each of the plurality of the first passage holes, and an upper electrode substrate, arranged above the lower electrode substrate, configured to be formed therein with a plurality of second passage holes through which the multiple electron beams pass, whose size from a top surface of a body of the upper electrode substrate to a middle of a way to a back side of the upper electrode substrate is a second hole diameter, and whose size from the middle to the back side is a third hole diameter larger than the first hole diameter and larger than the second hole diameter, wherein a shield electrode is disposed on inner walls of the plurality of second passage holes.

According to another aspect of the present invention, a multiple electron beam irradiation apparatus includes
  an aberration corrector that corrects at least one of astigmatism and aberration distortion of multiple electron beams, the aberration corrector including
    a lower electrode substrate configured to be formed therein with a plurality of a first passage holes which has a first hole diameter and through which multiple electron beams pass, and to be arranged thereon a plurality of electrode sets each being a plurality of electrodes of four poles or more than four poles which surround a first passage hole of the plurality of the first passage holes for each of the plurality of the first passage holes, and
    an upper electrode substrate, arranged above the lower electrode substrate, configured to be formed therein with a plurality of second passage holes through which the multiple electron beams pass, whose size from a top surface of the upper electrode substrate to a middle of a way to a back side of the upper electrode substrate is a second hole diameter, and whose size from the middle to the back side is a third hole diameter larger than the first hole diameter and larger than the second hole diameter, wherein a shield electrode is disposed on inner walls of the plurality of second passage holes, and an electron optical system that leads multiple electron beams, whose at least one of astigmatism and aberration distortion has been corrected by the aberration corrector, to a target object.

DETAILED DESCRIPTION OF THE INVENTION

Embodiments below describe an aberration corrector in which the thickness of each electrode itself of a multipole lens can be thin, and multipole lenses for multiple electron beams are arranged in an array, and an inspection apparatus which mounts the aberration corrector therein.

Embodiments below describe a multiple electron beam inspection apparatus as an example of a multiple electron beam irradiation apparatus. The multiple electron beam irradiation apparatus is not limited to the inspection apparatus, and may be an apparatus, such as a writing apparatus, which emits multiple electron beams through an electron optical system, for example.

First Embodiment

Figure 1:
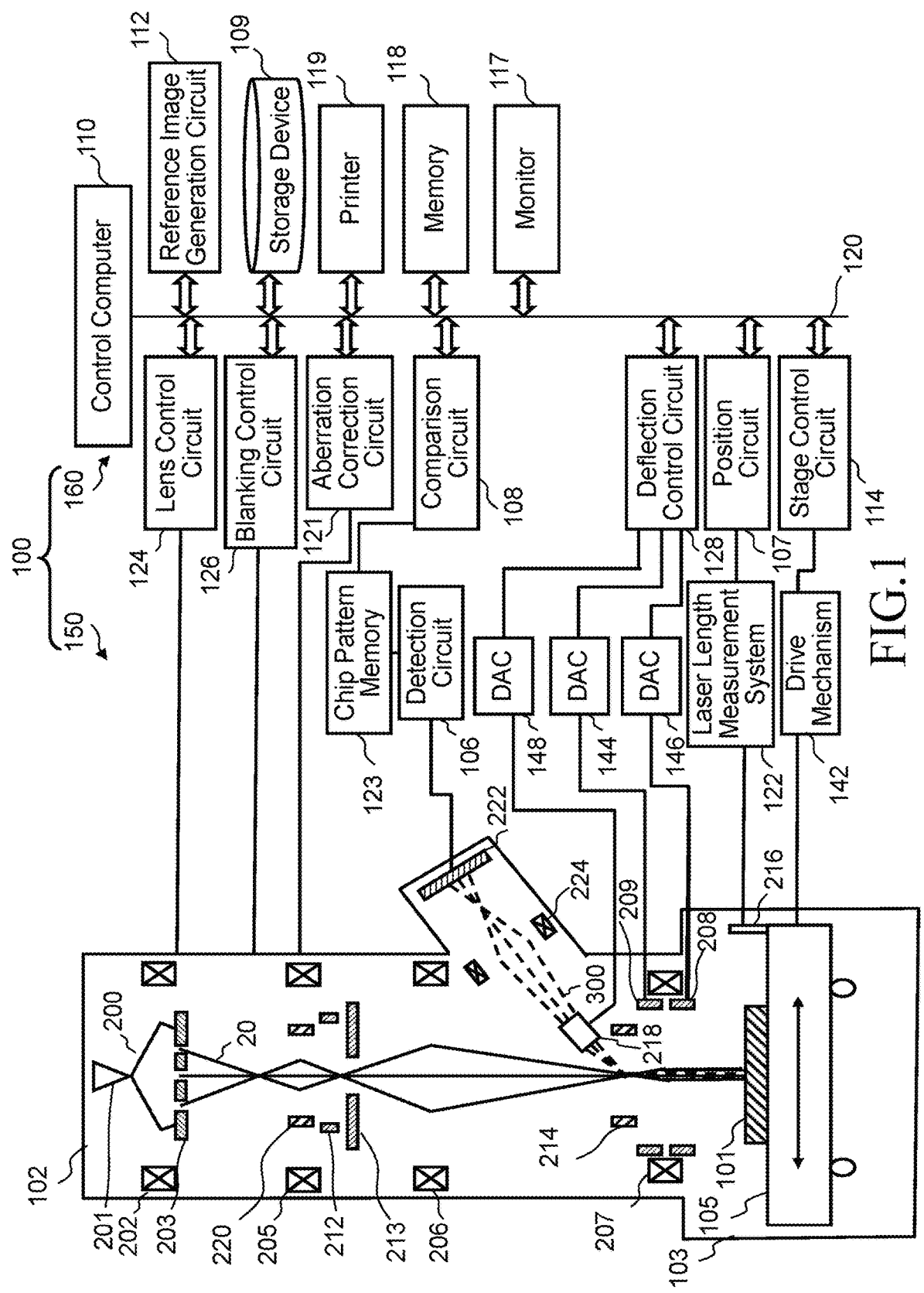
FIG. 1 shows an example of a configuration of a pattern inspection apparatus according to a first embodiment.

FIG. 1 shows an example of a configuration of a pattern inspection apparatus according to a first embodiment. In FIG. 1, an inspection apparatus 100 for inspecting patterns formed on a substrate is an example of a multiple electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, an aberration corrector 220, a common blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, and a multi-detector 222. A primary electron optical system is composed of the electron gun 201, the electromagnetic lens 202, the shaping aperture array substrate 203, the electromagnetic lens 205, the aberration corrector 220, the common blanking deflector 212, the limiting aperture substrate 213, the electromagnetic lens 206, the electromagnetic lens 207 (objective lens), the main deflector 208, and the sub deflector 209. A secondary electron optical system is composed of the electromagnetic lens 207, the beam separator 214, the deflector 218, and the electromagnetic lens 224.

A stage 105 movable at least in the x and y directions is disposed in the inspection chamber 103. A substrate 101 (target object) to be inspected is mounted on the stage 105. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. If the chip pattern formed on the exposure mask substrate is exposed and transferred onto the semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward on the stage 105, for example. Moreover, on the stage 105, there is disposed a mirror 216 which reflects a laser beam for measuring a laser length emitted from the laser length measuring system 122 disposed outside the inspection chamber 103. The multi-detector 222 is connected, at the outside of the electron beam column 102, to a detection circuit 106. The detection circuit 106 is connected to a chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, an aberration correction circuit 121, a lens control circuit 124, a blanking control circuit 126, a deflection control circuit 128, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The chip pattern memory 123 is connected to the comparison circuit 108. The stage 105 is driven by the drive mechanism 142 under the control of the stage control circuit 114. In the drive mechanism 142, a drive system such as a three (x-, y-, and θ-) axis motor which provides drive in the directions of x, y, and θ in the stage coordinate system is configured, and can move the stage 105 in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. In the stage coordinate system, the x, y, and θ directions are set with respect to a plane perpendicular to the optical axis of the multiple primary electron beams, for example.

The electromagnetic lenses 202, 205, 206, 207 (objective lens), and 224, and the beam separator 214 are controlled by the lens control circuit 124. The common blanking deflector 212 is configured by two or more electrodes (or "two or more poles"), and each electrode is controlled by the blanking control circuit 126 through a DAC amplifier (not shown). The aberration corrector 220 is configured by two or more electrode substrates stacked to be described later, and controlled by the aberration correction circuit 121. The sub deflector 209 is configured by four or more electrodes (or "four or more poles"), and each electrode is controlled by the deflection control circuit 128 through the DAC amplifier 144. The main deflector 208 is configured by four or more electrodes (or "four or more poles"), and each electrode is controlled by the deflection control circuit 128 through the DAC amplifier 146. The deflector 218 is configured by four or more electrodes (or "four or more poles"), and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, applying a voltage to another extraction electrode (Wehnelt) and heating the cathode to a predetermined temperature are performed, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
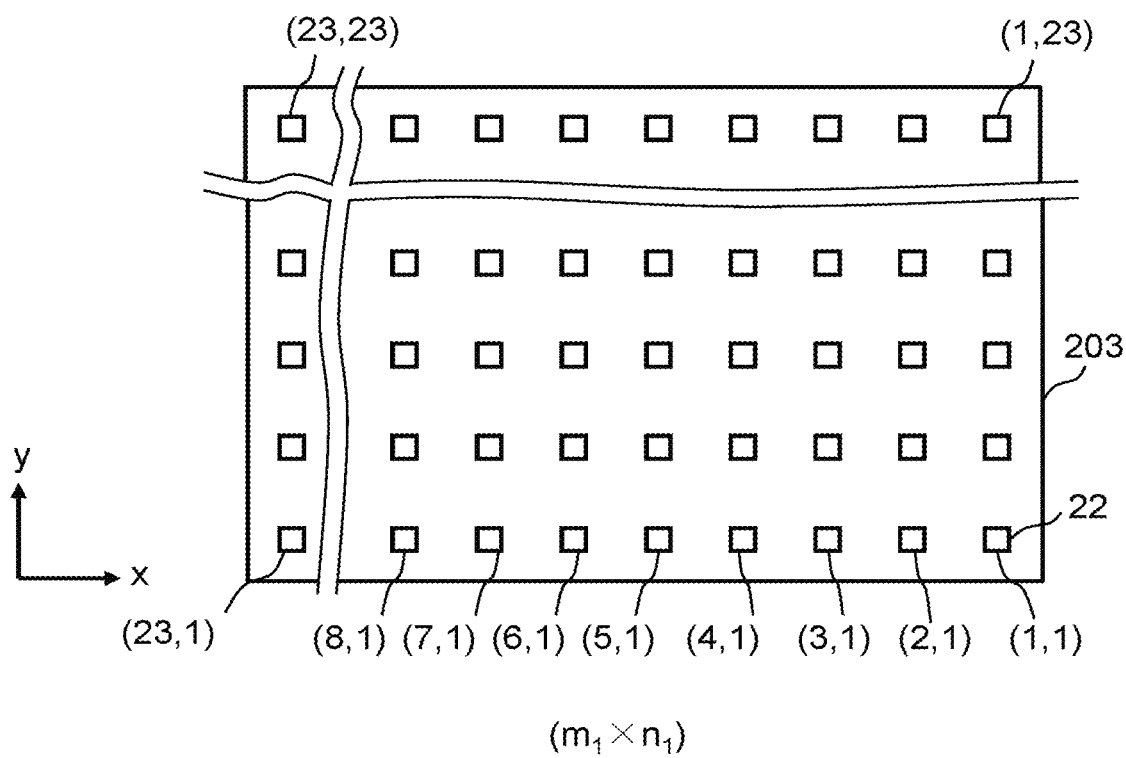
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $m_1$ rows long (length in the y direction) (each row in the x direction) and $n_1$ columns wide (width in the x direction) (each column in the y direction) are two-dimensionally formed at a predetermined arrangement pitch in the shaping aperture array substrate 203, where $m_1$ and $n_1$ are integers of 2 or more. In the case of FIG. 2, holes 22 of 23×23 are formed. Each of the holes 22 is a rectangle (including a square) having the same dimension, shape, and size. Alternatively, each of the holes 22 may be a circle with the same outer diameter. Multiple beams 20 are formed by letting portions of the electron beam 200 individually pass through a corresponding one of a plurality of holes 22. With respect to the arrangement of the holes 22, although the case where the holes 22 of two or more rows and columns are arranged in both the x and y directions is here shown, the arrangement is not limited thereto. For example, it is also acceptable that a plurality of holes 22 are arranged in only one row (in the x direction) or in only one column (in the y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where the holes are arranged like a grid in the width and length directions. For example, with respect to the kth and the (k+1) th rows which are arrayed (accumulated) in the length direction (in the y direction) and each of which is in the x direction, each hole in the kth row and each hole in the (k+1) th row may be mutually displaced in the width direction (in the x direction) by a dimension "a". Similarly, with respect to the (k+1) th and the (k+2) th rows which are arrayed (accumulated) in the length direction (in the y direction) and each of which is in the x direction, each hole in the (k+1) th row and each hole in the (k+2) th row may be mutually displaced in the width direction (in the x direction) by a dimension "b".

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all the plurality of holes 22 is irradiated by the electron beam 200. The multiple beams 20 (multiple primary electron beams) are formed by letting portions of the electron beam 200, which irradiate the positions of a plurality of holes 22, individually pass through a corresponding one of the plurality of holes 22 in the shaping aperture array substrate 203.

The formed multiple beams 20 are individually refracted by the electromagnetic lenses 205 and 206, and travel to the electromagnetic lens 207 (objective lens) while repeating forming an intermediate image and a crossover through the beam separator 214 disposed at the crossover position of each beam of the multiple beams 20. Meanwhile, the aberration corrector 220 corrects aberration such as an astigmatism and/or distortion aberration (distortion). FIG. 1 shows the case where the aberration corrector 220 is arranged in the magnetic field of the electromagnetic lens 205. By arranging the aberration corrector 220 in the magnetic field of the electromagnetic lens 205, the electric potential to be applied to the control electrode of the aberration corrector 220 can be low compared with that in the case of arranging it outside the magnetic field. For example, it can be reduced to about $\frac{1}{100}$. However, it is not limited thereto. The aberration corrector 220 should be arranged between the shaping aperture array substrate 203 and the beam separator 214.

When the multiple beams 20 are incident on the electromagnetic lens 207 (objective lens), the electromagnetic lens 207 focuses the multiple beams 20 onto the substrate 101. In other words, the electromagnetic lens 207 (example of electron optical system) leads the multiple beams 20, whose at least one of an astigmatism and an aberration distortion has been corrected by the aberration corrector 220, to the substrate 101. The multiple beams 20 having been focused on the substrate 101 (target object) by the objective lens 207 are collectively deflected by the main deflector 208 and the sub deflector 209 so as to irradiate respective beam irradiation positions on the substrate 101. When all of the multiple beams 20 are collectively deflected by the common blanking deflector 212, they deviate from the hole in the center of the limiting aperture substrate 213 and are blocked by the limiting aperture substrate 213. On the other hand, the multiple beams 20 which were not deflected by the common blanking deflector 212 pass through the hole in the center of the limiting aperture substrate 213 as shown in FIG. 1. Blanking control is provided by On/Off of the common blanking deflector 212 to collectively control On/Off of the multiple beams. Thus, the limiting aperture substrate 213 blocks the multiple beams 20 which were deflected to be in the "Off condition" by the common blanking deflector 212. Then, the multiple beams 20 for inspection (for image acquisition) are formed by beams having been made during a period from becoming "beam On" to becoming "beam Off" and having passed through the limiting aperture substrate 213.

When desired positions on the substrate 101 are irradiated with the multiple beams 20 (multiple primary electron beams), a flux of secondary electrons (multiple secondary electron beams 300) including reflected electrons each corresponding to each of the multiple beams 20 is emitted from the substrate 101 due to the irradiation by the multiple beams 20.

The multiple secondary electron beams 300 emitted from the substrate 101 travel to the beam separator 214 through the electromagnetic lens 207.

The beam separator 214 generates an electric field and a magnetic field to be perpendicular to each other in a plane perpendicular to the traveling direction (trajectory central axis) of the center beam of the multiple beams 20. The electric field affects/exerts a force in the same fixed direction regardless of the traveling direction of electrons. In contrast, the magnetic field affects/exerts a force according to Fleming's left-hand rule. Therefore, the direction of force acting on (applied to) electrons can be changed depending on the traveling (or "entering") direction of the electrons. With respect to the multiple beams 20 entering the beam separator 214 from the upper side, since the force due to the electric field and the force due to the magnetic field cancel each other out, the multiple beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple beams 20.

The multiple secondary electron beams 300 bent obliquely upward and separated from the multiple beams 20 are further bent by the deflector 218, and projected, while being refracted, onto the multi-detector 222 by the electromagnetic lens 224. The multi-detector 222 detects the projected multiple secondary electron beams 300. The multi-detector 222 includes, for example, a diode type two-dimensional sensor (not shown). Then, at the position of a diode type two-dimensional sensor corresponding to each beam of the multiple beams 20, each secondary electron of the multiple secondary electron beams 300 collides with the diode type two-dimensional sensor so as to generate an electron, and produces secondary electron image data for each pixel. An intensity signal detected by the multi-detector 222 is output to the detection circuit 106.

Figure 3:
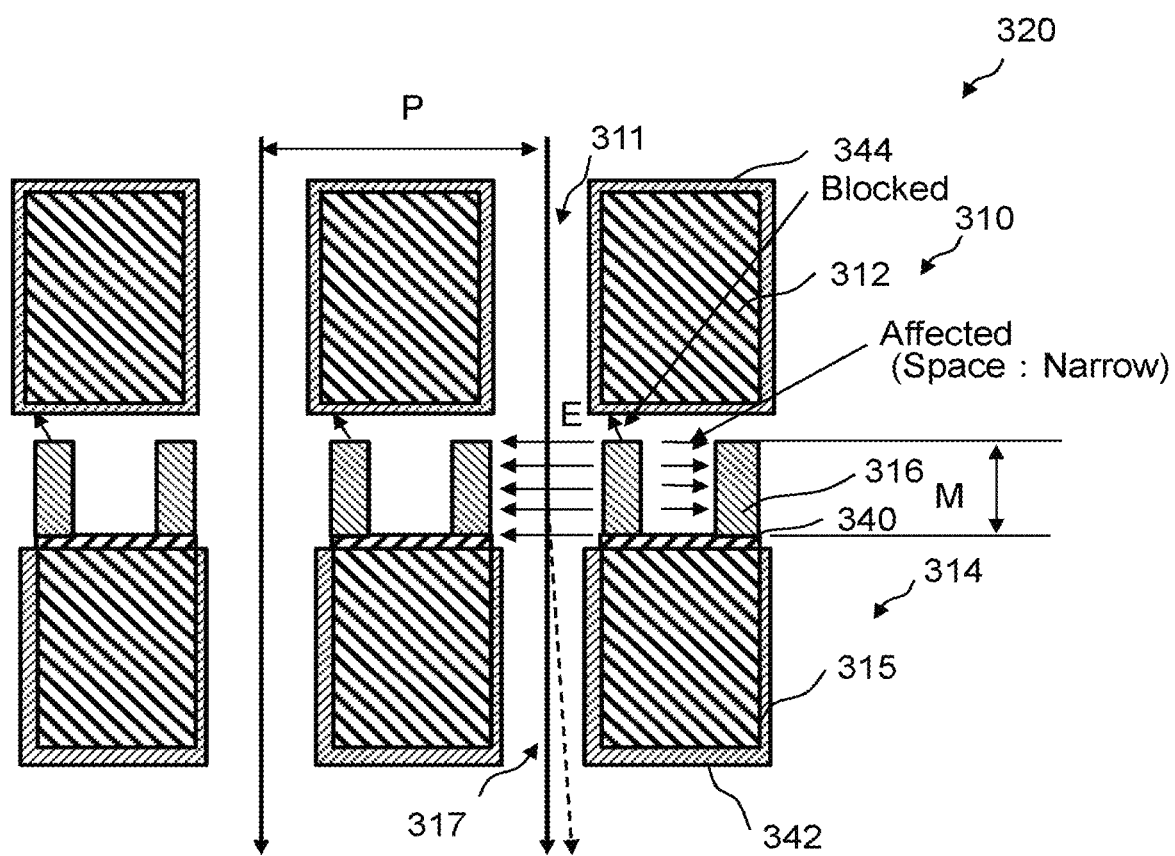
FIG. 3 shows an example of a section of a structure of an aberration corrector serving as a first comparative example of the first embodiment.

FIG. 3 shows an example of a section of a structure of an aberration corrector serving as a first comparative example of the first embodiment. In FIG. 3, an aberration corrector 320 being the first comparative example of the first embodiment is configured by an upper electrode substrate 310 and a lower electrode substrate 314. As for the upper electrode substrate 310, a plurality of passage holes 311 through which multiple beams pass are formed in a substrate body 312, and the entire exposed surface of the substrate body 312 is covered with a shield film 344. As for the lower electrode substrate 314, a plurality of passage holes 311 whose hole diameter size is the same as that of the upper electrode substrate 310 and through which multiple beams pass are formed in a substrate body 315. On the substrate body 315, a plurality of electrodes 316 serving as multipoles each surrounding the passage hole 311 are arranged through an insulating layer 340. Moreover, a shield film 342 is formed at the passage hole inner wall, the bottom, and the side of the substrate body 315. A ground potential is applied to the shield films 342 and 344. In order to correct an aberration such as an astigmatism and a distortion (distortion aberration), the trajectory of each of multiple beams needs to be corrected individually. Therefore, a plurality of electrodes 316 serving as multipoles each surrounding the passage hole 311 are arranged on the lower electrode substrate 314. Since the electric field E generated between the electrodes 316 facing each other across a corresponding one of a plurality of passage holes 311 does not extend upwards due to the upper electrode substrate 310, it acts in parallel between the counter electrodes 316. Therefore, the electric field F generated between the counter electrodes 316 is determined based on the thickness M of the electrode 316 itself. Accordingly, in order to apply a deflection amount which is just for correcting an aberration to each electron beam, the thickness M of each electrode 316 itself of a multipole lens needs to be about several tens of µm, such as 50 µm. From the standpoint of manufacturing process, it is desired to make the thickness of the electrode itself thin. When the pitch P between beams becomes narrower, as shown in FIG. 3, the space between the electrodes for adjacent beams also becomes narrower. If the space between the electrodes for adjacent beams becomes narrow, influence is given to the control voltage to the adjacent beam. In that case, the influence to the adjacent beam increases according to the thickness of the electrode 316 itself. As a result, the control voltage affects the control to the adjacent beam. Accordingly, the effect of reducing the influence on the adjacent beam can be acquired by making the thickness of the electrode thin.

Figure 4A:
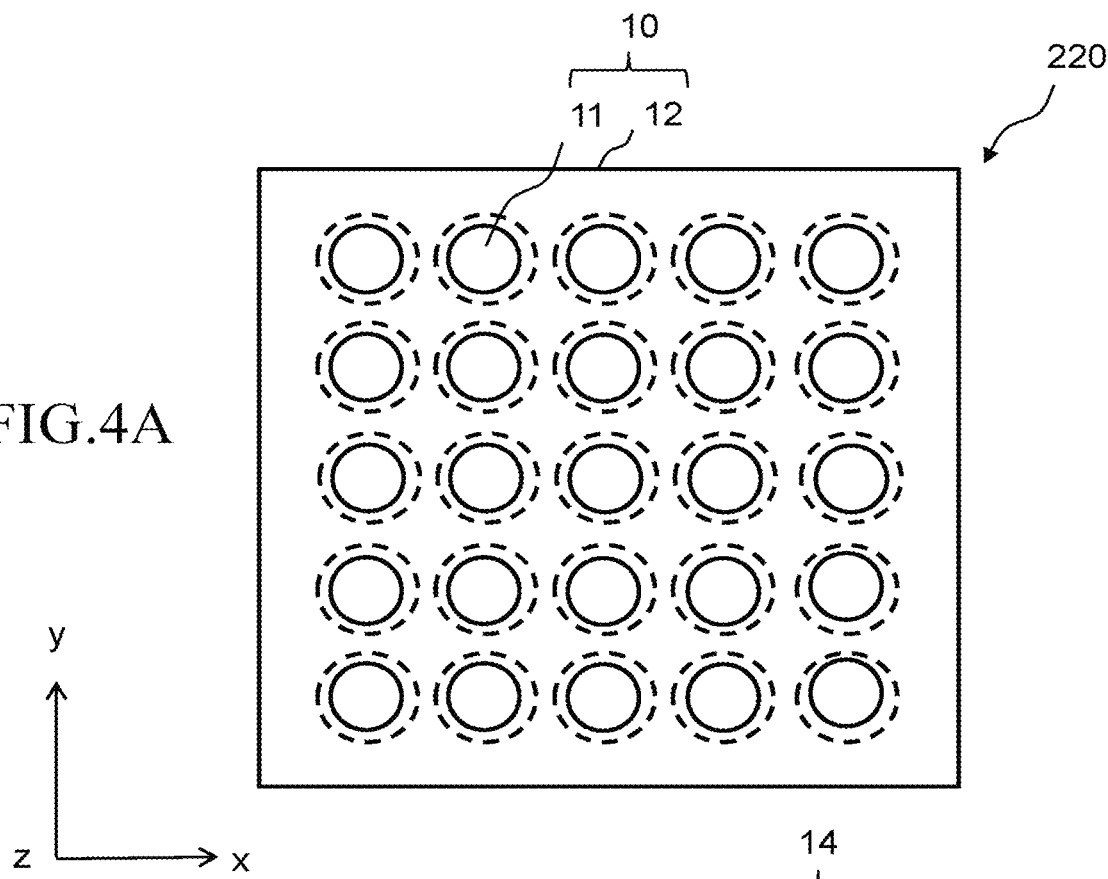
FIGS. 4A and 4B are top views showing structure examples of each electrode substrate of an aberration corrector according to the first embodiment.
Figure 4B:
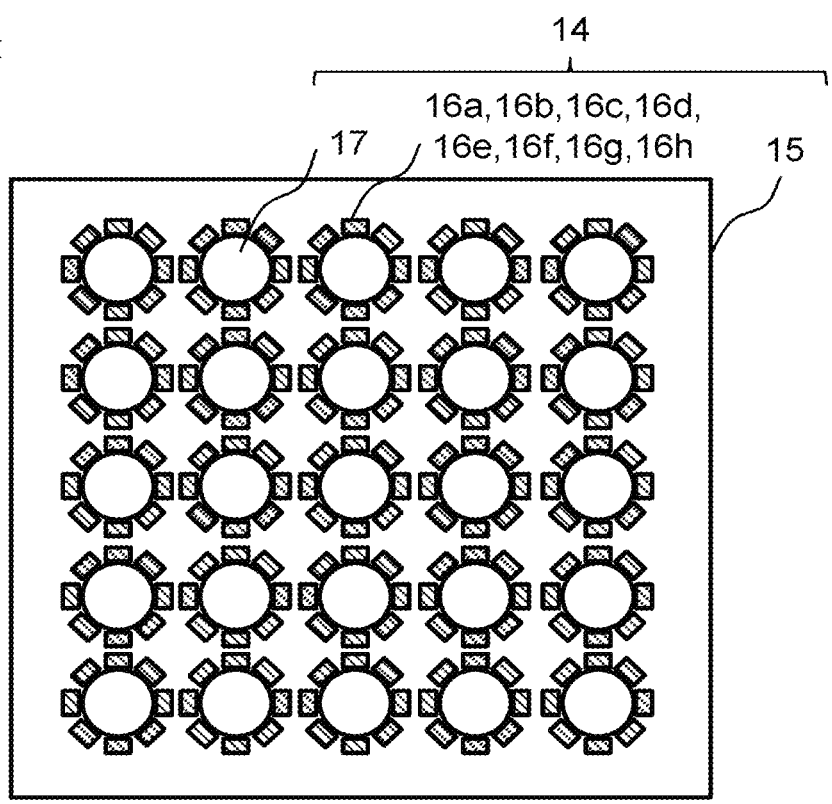

FIGS. 4A and 4B are top views showing structure examples of each electrode substrate of an aberration corrector according to the first embodiment.

Figure 5:
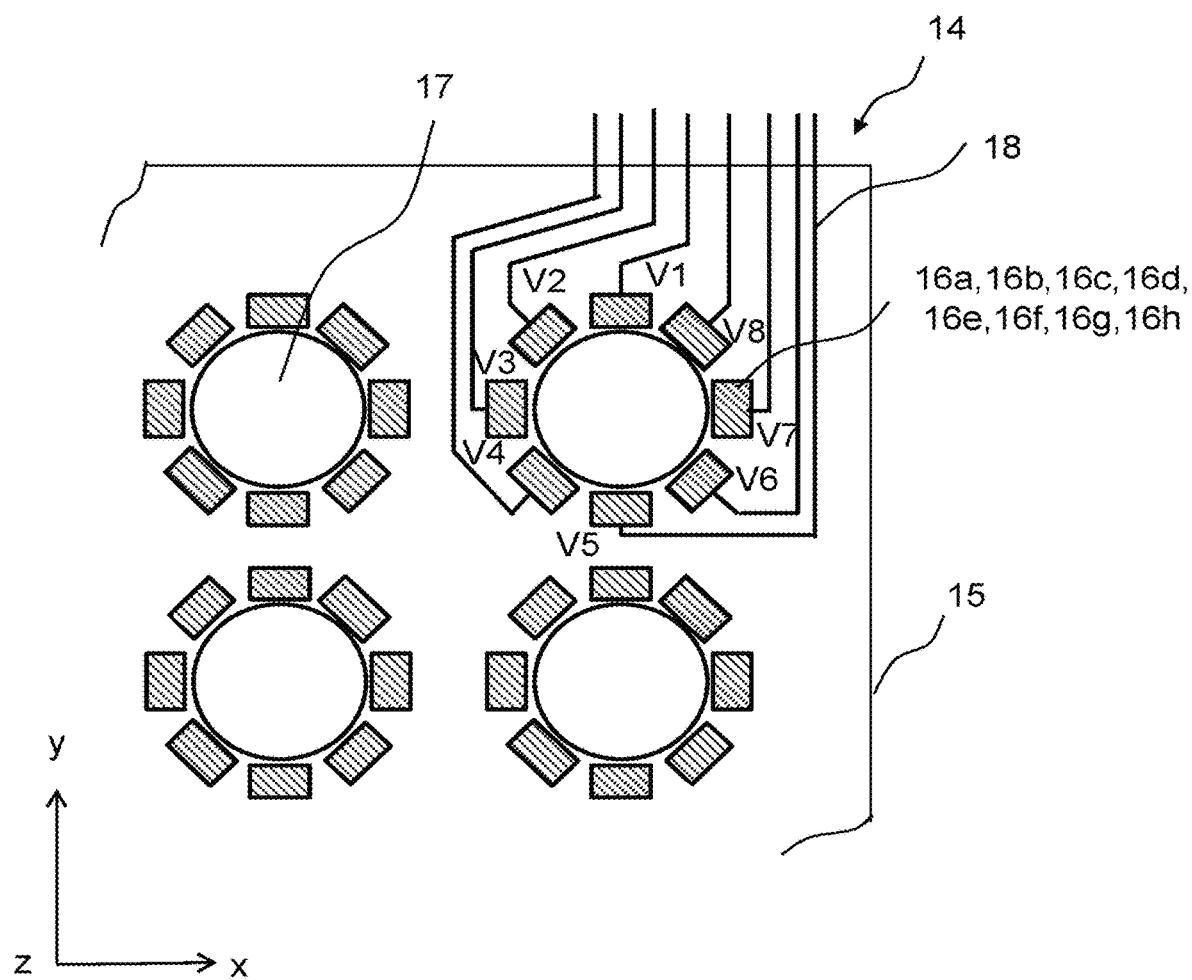
FIG. 5 is a top view showing a wiring example of a multipole of an aberration corrector according to the first embodiment.

FIG. 5 is a top view showing a wiring example of a multipole of an aberration corrector according to the first embodiment.

Figure 6:
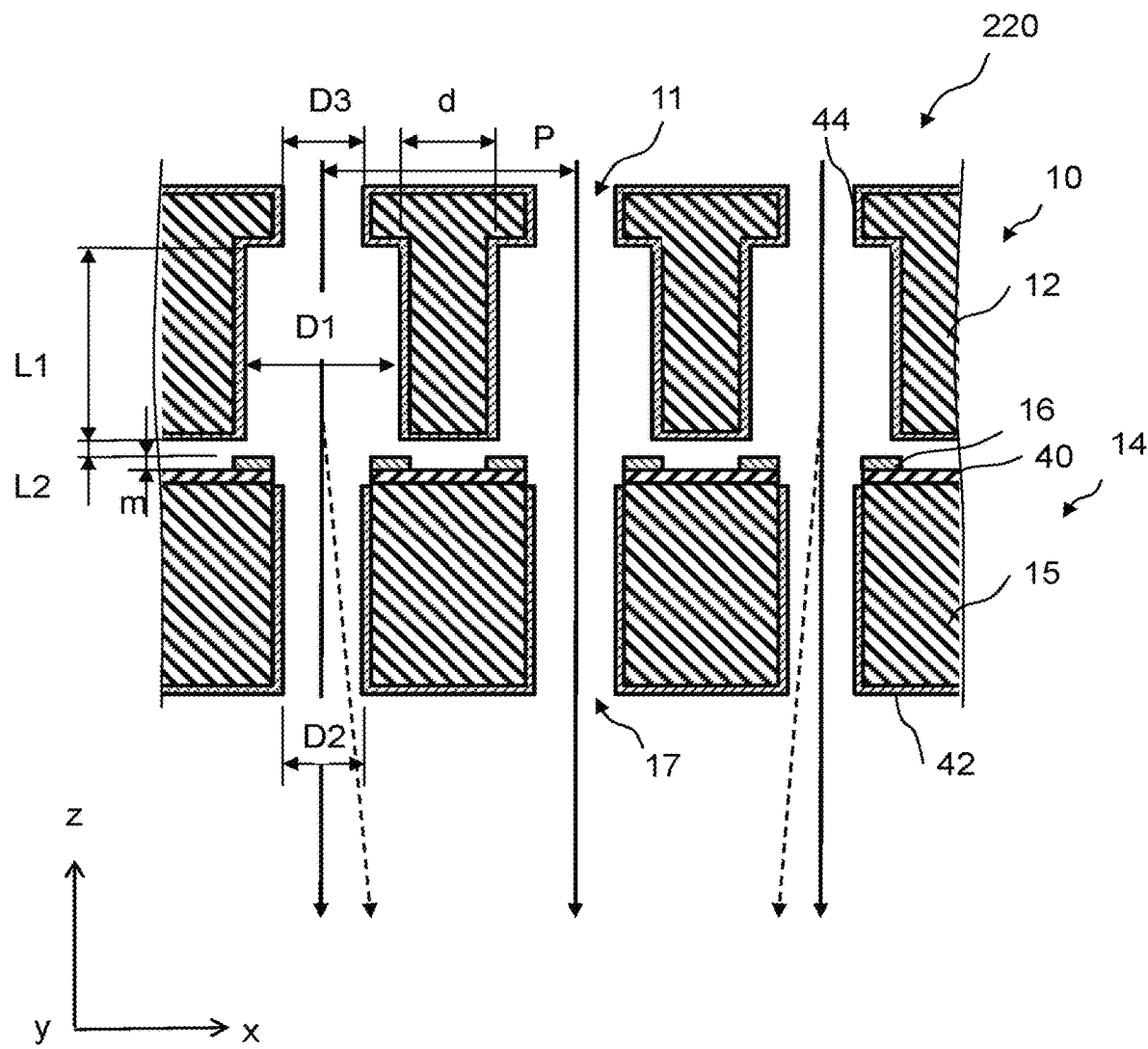
FIG. 6 is a sectional view showing a structure example of an aberration corrector according to the first embodiment.

FIG. 6 is a sectional view showing a structure example of an aberration corrector according to the first embodiment.

The aberration corrector 220 is configured by two or more electrode substrates stacked with a predetermined space therebetween. The examples of FIGS. 4A, 4B, and 6 show the aberration corrector 220 configured by, for example, two electrode substrates stacked with the gap L2 therebetween, the upper electrode substrate 10 and the lower electrode substrate 14. In other words, the upper electrode substrate 10 is arranged, with the gap L2, above the lower electrode substrate 14. In the examples of FIGS. 4A and 4B, 5×5 multiple beams 20 are used. FIGS. 5 and 6 show the portions including a region through which some of the 5×5 multiple beams 20 pass.

As for the upper electrode substrate 10, a plurality of passage holes 11 (the second passage holes) through which the multiple beams 20 pass are formed in the substrate body 12. FIGS. 4A and 6 show the case where a plurality of passage holes 11 are formed at the positions through which the multiple beams 20 with a beam pitch P pass in the upper electrode substrate 10. Regarding each passage hole 11, its size from the top surface of the substrate body 12 to the middle of the way to the back side of the substrate body 12 is a hole diameter D3 (the second hole diameter), (where the top surface is the upstream side of the beam travelling direction), and its size from the middle to the back side is a hole diameter D1 (the third hole diameter) being larger than D3. As shown in FIG. 6, the top surface, side surface, and bottom surface of the substrate body 12, and the inner walls of a plurality of passage holes 11 are covered with a shield electrode 44. The shield electrode 44 is disposed at least at the inner walls of a plurality of passage holes 11. A ground (GND) electric potential is applied to the shield electrode 44 from the aberration correction circuit 121. The shield electrode 44 to which the GND potential is applied is electrically connected, at the outer part of the substrate body 12, to the aberration correction circuit 121 through a connector, a cable, and the like.

As for the lower electrode substrate 14, a plurality of passage holes 17 (the first passage holes) whose hole diameter is D2 (the first hole diameter) and through which the multiple beams 20 pass are formed in the substrate body 15. As shown in FIGS. 4B and 6, in the lower electrode substrate 14, a plurality of passage holes 17 are formed at the positions through which the multiple beams 20 with the beam pitch P pass. Further, a plurality of electrode sets each being a plurality of electrodes 16 (a to h) which are a multipole of four or more poles, are arranged on the lower electrode substrate 14, and the plurality of electrodes 16 surround a passage hole 17 of a plurality of passage holes 17 for each of the plurality of passage holes 17. FIGS. 4A, 4B, and 6 show the case where octupole electrodes 16 (a to h) are arranged. For example, in the case of correcting a distortion aberration of the multiple beams 20, it is sufficient to have quadrupole electrodes 16 in which dipoles are opposite to each other perpendicularly (x and y directions). For example, in the case of correcting an astigmatism of the multiple beams 20, for each beam, it is preferable that octupole electrodes 16 are disposed in which, in addition to the perpendicular (x and y directions) dipoles, facing dipoles are arranged in 45° and 135° directions being intermediate phases. If the direction of the astigmatism is known, it is also sufficient to have quadrupole electrodes 16 in which dipoles are opposite to each other perpendicular (x and y directions). Moreover, as for the lower electrode substrate 14, an insulating layer 40 is arranged between the substrate body 15 and a plurality of electrodes 16 (a to h) for respective beams. As shown in FIG. 5, on the insulating layer 40, a wiring 18 for each of the electrodes 16 (V1 to V8) extends to the outer part of the substrate body 15, and is electrically be connected to the aberration correction circuit 121 through a connector, a cable, and the like. Aground (GND) electric potential is applied to a shield electrode 42 from the aberration correction circuit 121. The shield electrode 42 to which the GND potential is applied may be electrically connected to the aberration correction circuit 121 through a connector for respective electrodes 16, a cable, and the like. The side surface and bottom surface of the substrate body 15, and the inner walls of a plurality of passage holes 17 are covered with the shield electrode 42. A plurality of electrodes 16 (a to h) for respective beams, and the shield electrode 42 are separated by the insulating layer 40.

As the material of the substrate body 12 of the upper electrode substrate 10, and that of the substrate body 15 of the lower electrode substrate 14, for example, it is preferable to use silicon (Si). For example, an Si substrate having a film thickness of about several 100 µm is preferable for the substrate bodies 12 and 15. Specifically, for example, the Si substrate preferably has a film thickness of about 200 to 500 µm. As the material of a plurality of electrodes 16 (a to h) for each beam of the lower electrode substrate 14, it is preferable to use, for example, a metal not being easily oxidized, such as aluminum (Al), platinum (Pt), titanium (Ti), or palladium (Pd). For example, each electrode 16 (a to h) is formed to have a film thickness of several µm. Specifically, for example, each electrode 16 (a to h) is formed to have a film thickness of 1 to 10 µm. As for both of the shield electrode 44 formed on the top surface, side surface, and bottom surface of the substrate body 12 and the inner walls of a plurality of passage holes 11, and the shield electrode 42 formed on the side surface and bottom surface of the substrate body 15 and inner walls of a plurality of passage holes 17 are formed to have a film thickness of several µm. For example, they are covered with the shield electrodes 42 and 44 having a film thickness of 1 to 10 µm. Similarly to the case of the electrode 16, it is preferable to use a metal not being easily oxidized, such as Al, Pt, Ti, or Pd as the material of the shield electrodes 42 and 44. In other words, the top surface, side surface, and bottom surface of the substrate body 12 made of Si material and inner walls of a plurality of passage holes 11 are coated with, for example, Al film serving as the shield electrode 44. Similarly, the side surface and bottom surface of the substrate body 15 made of Si material and inner walls of a plurality of passage holes 17 are coated with, for example, Al film serving as the shield electrode 42.

As shown in FIG. 6, the hole diameter D1 (the third diameter) of each passage hole 11 of the upper electrode substrate 10 is formed to be larger than the hole diameter D2 (the first hole diameter) of each passage hole 17 of the lower electrode substrate 14. That is, D1>D2. The hole diameter D3 (the second hole diameter) which is the hole diameter from the top surface of the substrate body 12 to the middle of the way to the back side of the substrate body 12, at the upper part of each passage hole 11 of the upper electrode substrate 10, is formed to be smaller than the hole diameter D1 which is the hole diameter from the middle to the back side, at the lower part of each passage hole 11 of the upper electrode substrate 10. In other words, a flange portion extending to the inner side of the passage hole 11 is formed at the upper part of each passage hole 11 of the upper electrode substrate 10. The size of the hole diameter D2 of each passage hole 17 of the lower electrode substrate 14 may be the same as that of the hole diameter D3 at the upper part of each passage hole 11 of the upper electrode substrate 10. For example, it is preferable that D1 being the sum of the size in the x direction of the facing two electrodes 16 is formed to be larger than D2 or D3 such that the upper part of the two counter electrodes 16 is open as the passage hole 11. For example, it is preferable that, when each of D2 and D3 is formed to be about several 100 µm, D1 is formed to be larger than D2 or D3 by about several 10 µm (e.g., 10 to 50 µm).

Figure 7:
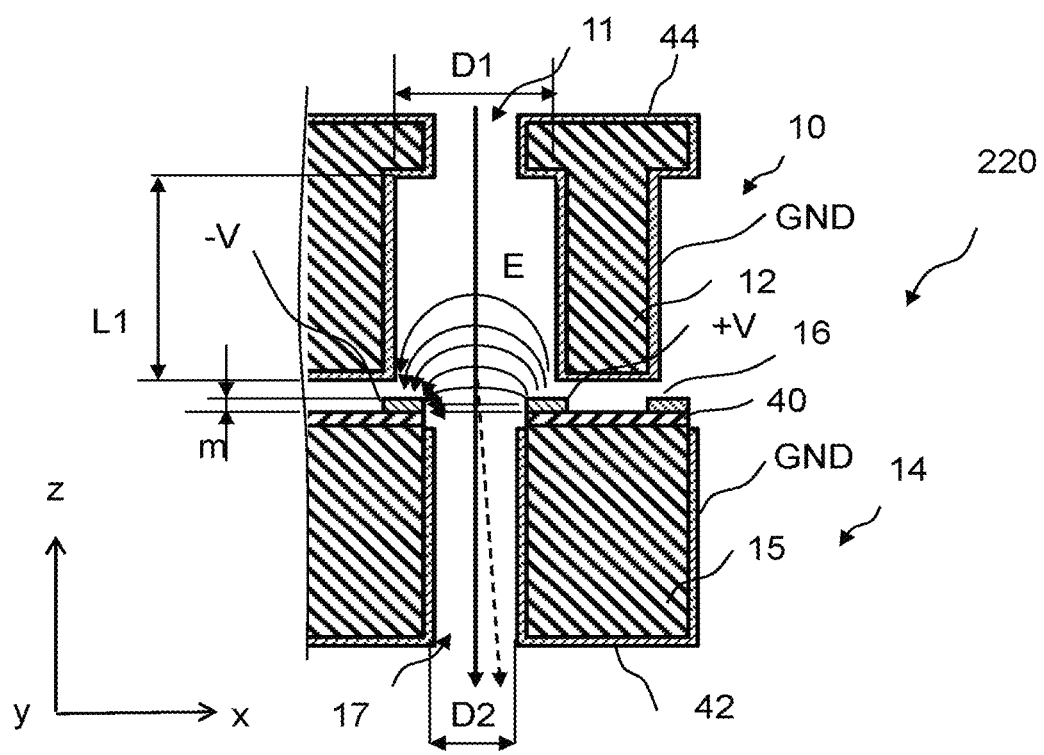
FIG. 7 shows an example of an electric field generated between electrodes for one beam of an aberration corrector according to the first embodiment.

FIG. 7 shows an example of an electric field generated between electrodes for one beam of an aberration corrector according to the first embodiment. +V potential is applied to one of two counter electrodes in a plurality of electrodes 16 for one beam. −V potential whose sign has been reversed and which has the same electric potential is applied to the other one. Moreover, as described above, the GND potential is applied to the shield electrodes 42 and 44. In other words, +V potential larger than the GND potential is applied to one of the two counter electrodes, and −V potential smaller than the GND potential is applied to the other one. Therefore, generated is an electric field E travelling from the electrode 16 to which +V potential has been applied to the electrode 16 to which −V potential has been applied. When the GND potential is 0V, a potential of +5V to +15V, for example, is applied as +V, and a potential of −15V to −5V, for example, is applied as −V.

In the first comparative example shown in FIG. 3 described above, since the upper part of the electrode 316 is closed by the upper electrode 310, an electric field is absorbed (or blocked) by the upper electrode 310. Therefore, it is impossible to generate the electric field E in the space other than the space between the two counter electrodes 316. Accordingly, if the entering electron beam does not reach the space between the two counter electrodes 316, an electric field cannot be generated. Accordingly, the deflection fulcrum is located near the center position in the height direction (thickness direction) of the electrode 316. Therefore, the thick electrode 316 with a large thickness is needed. On the other hand, in the aberration corrector 220 according to the first embodiment, as shown in FIG. 7, each passage hole 11 of the upper electrode substrate 10 is formed to be wider than each passage hole 17 of the lower electrode substrate 14. Then, the upper part of the electrode 16 is open due to the passage hole 11. Therefore, it is possible to extend the electric field E also to the space in the passage hole 11 above the two counter electrodes 16. Moreover, in the aberration corrector 220 according to the first embodiment, since the upper part of each passage hole 11 of the upper electrode substrate 10 is narrowed by the flange portion, from the hole diameter D1 to the hole diameter D3, the direction of the line of electric force can be easily bent. Therefore, the electric field E can be formed in the passage hole 11 above the two counter electrodes 16, without being emitted upward the upper electrode substrate 10. Accordingly, it is possible to act an electric field on the electron beam entering each passage hole 11 of the upper electrode substrate 10, while the beam is passing through each passage hole 11. Thus, the deflection fulcrum can be formed in the middle of the passage hole 11 above the electrode 16. Because of this, the thickness of the electrode 16 itself can be made narrow.

The aberration corrector 220 shown in FIG. 6 is formed such that the value (d/L2) obtained by dividing the distance d between adjacent passage holes 11 at the portion having the hole diameter D1 in the upper electrode substrate 10 by the gap L2 between the lower electrode substrate 14 and the upper electrode substrate 10 is equal to or greater than a threshold Th.

Figure 8A:
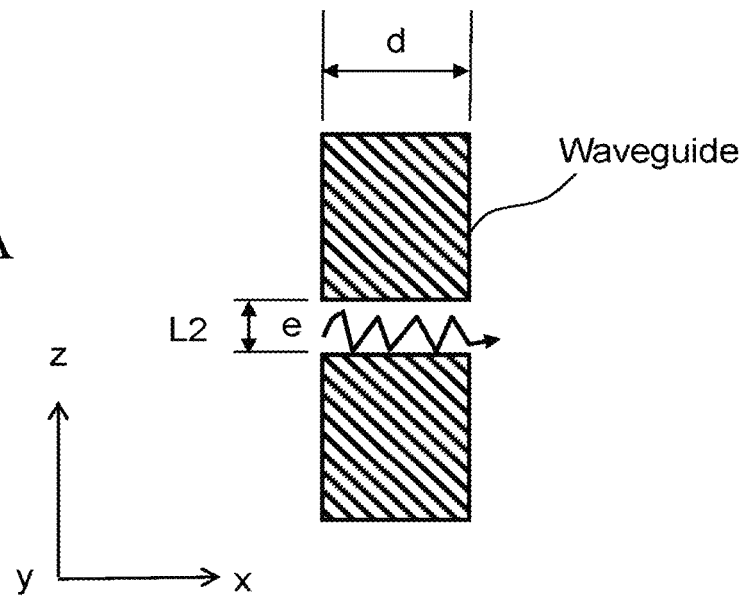
FIGS. 8A and 8B illustrate attenuation of an electric field according to the first embodiment.
Figure 8B:
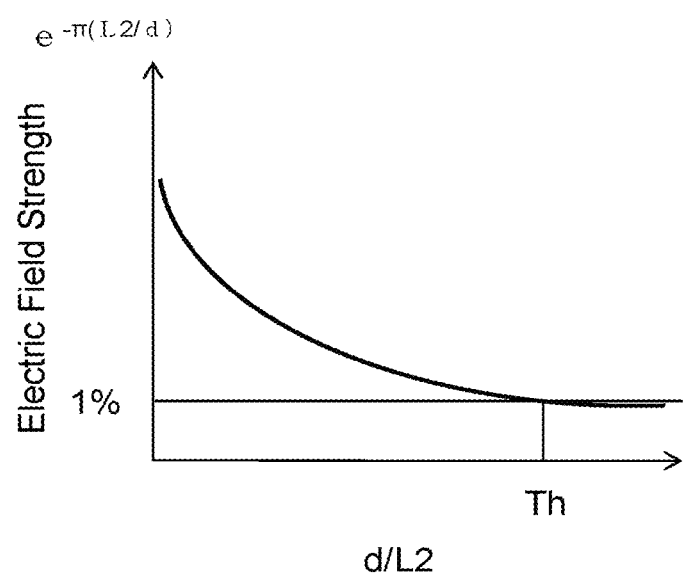

FIGS. 8A and 8B illustrate attenuation of an electric field according to the first embodiment. FIG. 8A shows a model explaining attenuation of an electric field. FIG. 8A shows the case, as a model, where an electron moves through the waveguide whose hole diameter is L2 and length is d. In FIG. 8B, the ordinate axis represents the rate of electrons passing the waveguide, and the abscissa axis represents an aspect ratio obtained by dividing the length d of the waveguide by the hole diameter L2. It turns out that, in proportion as the aspect ratio obtained by dividing the length d of the waveguide by the hole diameter L2 becomes large, the rate of electrons passing through the waveguide attenuates. In other words, it becomes difficult for beams to pass, and therefore, the electric field to be generated attenuates. If this model is applied to the aberration corrector 220 according to the first embodiment, in accordance with the value (d/L2) becoming larger, which is obtained by dividing the distance d between adjacent passage holes 11 at the portion where a plurality of passage holes 11 each having the hole diameter D1 are formed in the upper electrode substrate 10 by the gap L2 between the lower electrode substrate 14 and the upper electrode substrate 10, it becomes difficult for beams to move to the electrode 16 for the adjacent beam. By setting d/L2≥Th, the electric field formed by the multipolar electrode 16 for each beam can be prevented from being affected by the potential for the adjacent beam. For example, preferably, a value is set as the threshold Th based on which the attenuation graph defined by an exponential function converges, or based on which the number of passing electrons near the convergence is 1% or less. For example, preferably, the threshold Th is 2 to about 10. More preferably, the threshold Th is 3 to 7.

Since the thickness of the electrode 16 can be made thin, such as several μm, in the aberration corrector 220 according to the first embodiment, the gap L2 in the example of FIG. 6 is defined to be between the lower surface of the upper electrode substrate 10 and the top surface of the electrode 16 of the lower electrode substrate 14. As for the space between the electrodes 16 of actual adjacent beams, since the thickness of the electrode 16 itself is also included, it is preferable to set the threshold Th in consideration of the thickness of the electrode 16.

Moreover, according to the first embodiment, since the electric field E is formed above the two counter electrodes 16 as shown in FIG. 7, it is necessary for electrons to be able to move above the electrode 16. Therefore, as for the thickness of the upper electrode substrate 10, the thickness L1 of the portion where a plurality of passage holes 11 are formed with the hole diameter D1 is larger than at least the gap L2 between the lower electrode substrate 14 and the upper electrode substrate 10. In other words, the lower electrode substrate 14 and the upper electrode substrate 10 are arranged so as to be L1>L2. Moreover, it is desirable that the electric field attenuates in the passage hole 11 with the hole diameter D1 and it does not extend to the portion with the hole diameter D3. Therefore, preferably, the thickness L1 is set to be L1>D1.

As described above, in the aberration corrector 220 according to the first embodiment, the relation holds that D1>D2, L1>L2, and d/L2≥Th. Furthermore, it is preferable to be L1>D1.

Figure 9:
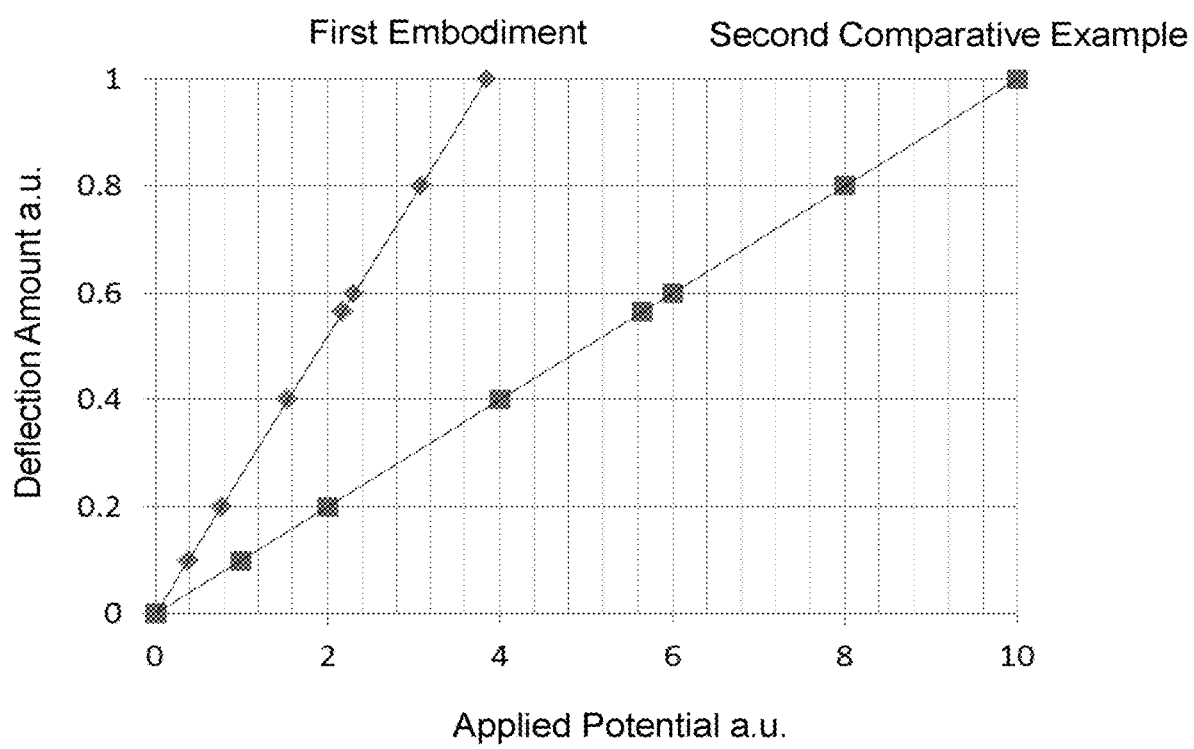
FIG. 9 shows an example of a relation between a deflection amount and an applied potential according to the first embodiment and a second comparative example.

FIG. 9 shows an example of a relation between a deflection amount and an applied potential according to the first embodiment and a second comparative example. In FIG. 9, the ordinate axis represents a beam deflection amount and the abscissa axis represents an electric potential applied to one of the two counter electrodes. The second comparative example of FIG. 9 shows the case of using an aberration corrector which has the same thickness as that of the electrode 16 of the first embodiment, and in which the upper part of the electrode 16 is closed by the upper electrode substrate. In other words, D1=D2 in the second comparative example. As shown in FIG. 9, it turns out that, when applying the same electric potential, the deflection amount in the case of the first embodiment, where the electric field E extends to the space above the electrode 16, is larger than the deflection amount in the case of the the second comparative example, where the electric field is formed only in the space between the electrodes 16. Conversely, the thickness of the electrode 16 itself can be made narrow by extending the electric field E to the space above the electrode 16.

Figure 10A:
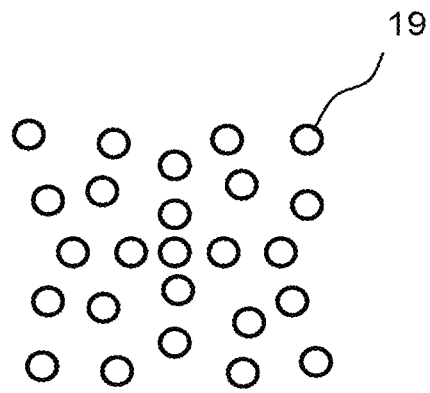
FIGS. 10A and 10B show an example of distortion aberration (distortion) according to the first embodiment.
Figure 10B:
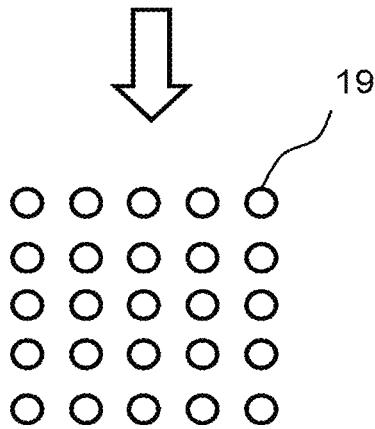

FIGS. 10A and 10B show an example of distortion aberration (distortion) according to the first embodiment. In the case of FIGS. 10A and 10B, 5×5 multiple beams 20 are used. If a plurality of holes 22 are formed in a matrix in the x and y directions at a predetermined pitch in the shaping aperture array substrate 203, ideally, as shown in FIG. 10B, irradiation positions 19 of the multiple beams 20 on the substrate 101 should also be arranged in a matrix with a predetermined reduction ratio. However, when the electron optical system of electromagnetic lenses, etc., is used, distortion (distortion aberration) occurs as shown in FIG. 10A. With respect to the shape of the distortion, depending on conditions, it represents a distribution called a barrel type or a pincushion type. Generally, distortion of a magnetic lens shifts not only in the radial direction but also in the rotational direction. FIG. 10A shows the case under conditions of not generating rotational components. Even if a certain amount of tendency exists in the direction of distortion and the amount of positional deviation in the multiple beams 20, it differs for each beam. Therefore, in order to correct such distortion, it is necessary to perform correction for each individual beam. Using the aberration corrector 220 according to the first embodiment, the irradiation positions 19 of the multiple beams 20 on the substrate 101 can be corrected by correcting the beam trajectory for each beam as shown in FIG. 10B.

Figure 11A:
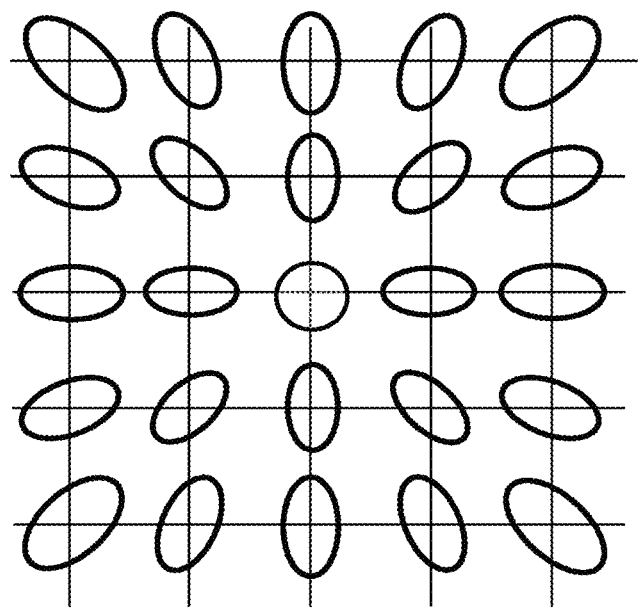
FIGS. 11A and 11B show an example of astigmatism according to the first embodiment.
Figure 11B:
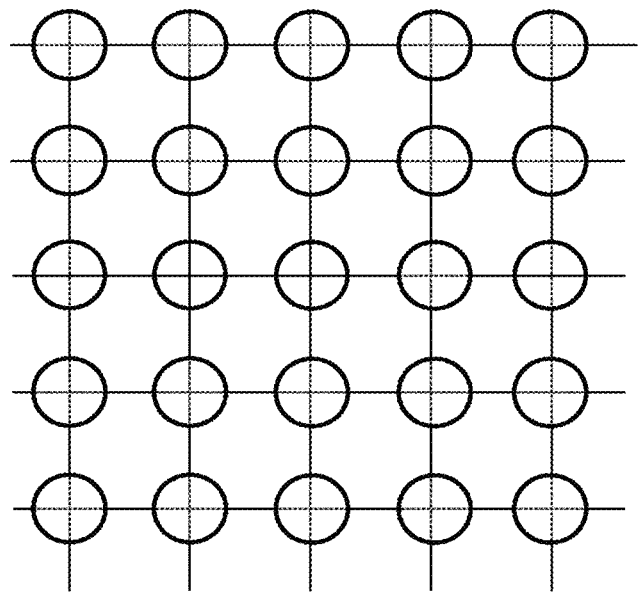

FIGS. 11A and 11B show an example of astigmatism according to the first embodiment. In the case of FIGS. 11A and 11B, 5×5 multiple beams 20 are used. As shown in FIG. 11B, ideally, the shape of irradiation with each beam is circular. However, when the electron optical system of electromagnetic lenses and the like is used, astigmatism occurs as shown in FIG. 11A. Therefore, as shown in FIG. 11A, the focus position shifts in the two-dimensional x and y directions on the substrate 101 (target object), which makes the beam a so-called elliptic format the focus position, and thus, blur occurs in the irradiating beam. Although the direction of astigmatism and the amount of positional deviation in the multiple beams 20 tend to become an elliptic form extending radially from the center of the multiple beams 20, it differs for each beam. Therefore, in order to correct such astigmatism, it is necessary to perform correction for each individual beam. Then, as shown in FIG. 11B, the astigmatism can be corrected by correcting the beam trajectory of each beam by using the aberration corrector 220 according to the first embodiment.

Figure 12A:
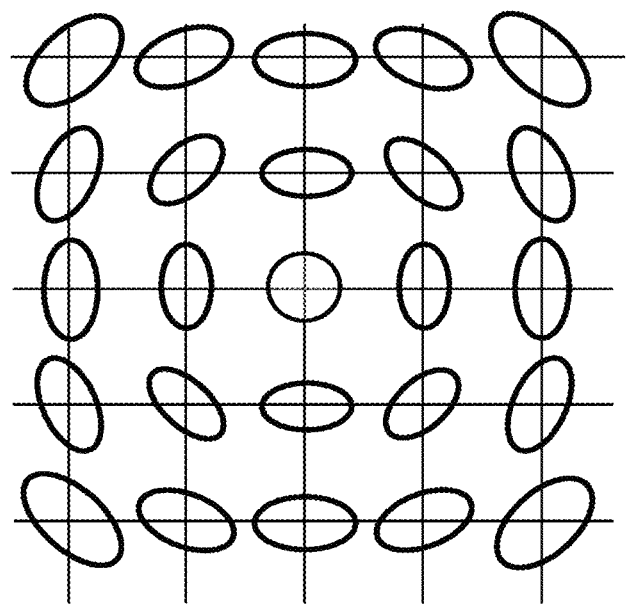
FIGS. 12A and 12B show another example of astigmatism according to the first embodiment.
Figure 12B:
Figure 12B:
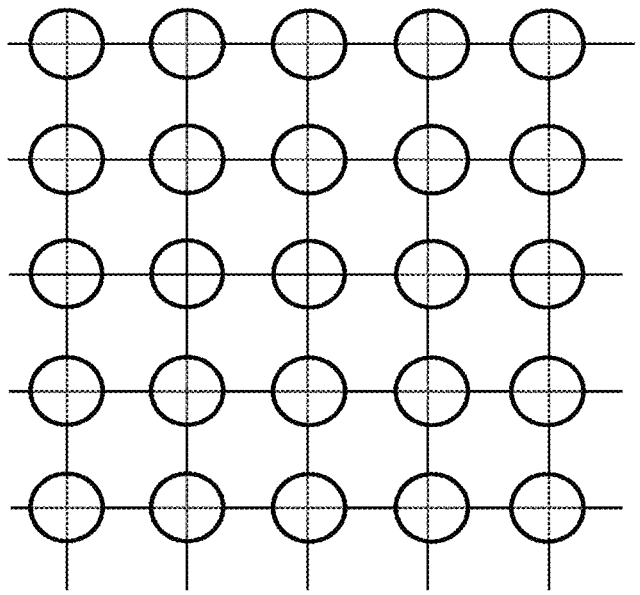

FIGS. 12A and 12B show another example of astigmatism according to the first embodiment. The direction of the astigmatism occurring in the multiple beams 20 is not limited to the case of extending radially from the center of the multiple beams 20 as shown in FIG. 11A. It may extend in the circumferential direction as shown in FIG. 12A. Also in that case, the astigmatism can be similarly corrected as shown in FIG. 12B by correcting the beam trajectory of each beam by using the aberration corrector 220 according to the first embodiment.

Moreover, the aberration corrector 220 according to the first embodiment can correct distortion and astigmatism at the same time.

Figure 13:
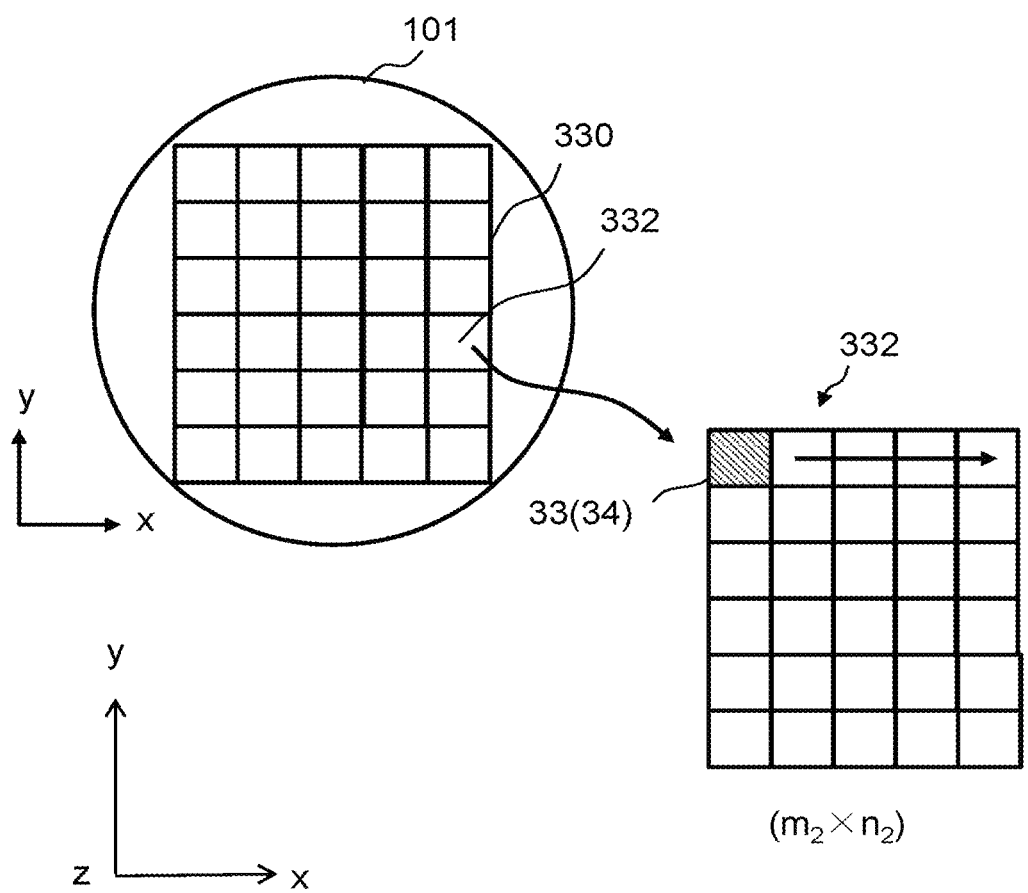
FIG. 13 shows an example of a plurality of chip regions formed on a semiconductor substrate, according to the first embodiment.

The image acquisition mechanism 150 acquires a secondary electron image of a pattern formed on the substrate 101, using the multiple beams 20 (multiple primary electron beams) whose at least one of astigmatism and distortion aberration has been corrected by the aberration corrector 220. Specifically, it operates as follows:

FIG. 13 shows an example of a plurality of chip regions formed on a semiconductor substrate, according to the first embodiment. In FIG. 13, in the case of the substrate 101 being a semiconductor substrate (wafer), a plurality of chips (wafer dies) 332 in a two-dimensional array are formed in an inspection region 330 of the semiconductor substrate (wafer die). A mask pattern for one chip formed on an exposure mask substrate has been reduced to ¼, for example, and exposed/transferred onto each chip 332 by an exposure device (stepper) (not shown). The inside of each chip 332 is divided into a plurality of mask dies 33 two-dimensionally arrayed in $m_2$ columns wide (width in the x direction) and $n_2$ rows long (length in the y direction) (each of $m_2$ and $n_2$ is an integer of 2 or more), for example. In the first embodiment, the mask die 33 serves as a unit inspection region. Applying/moving beams to the mask die 33 concerned is achieved by collectively deflecting all the multiple beams 20 by the main deflector 208.

Figure 14:
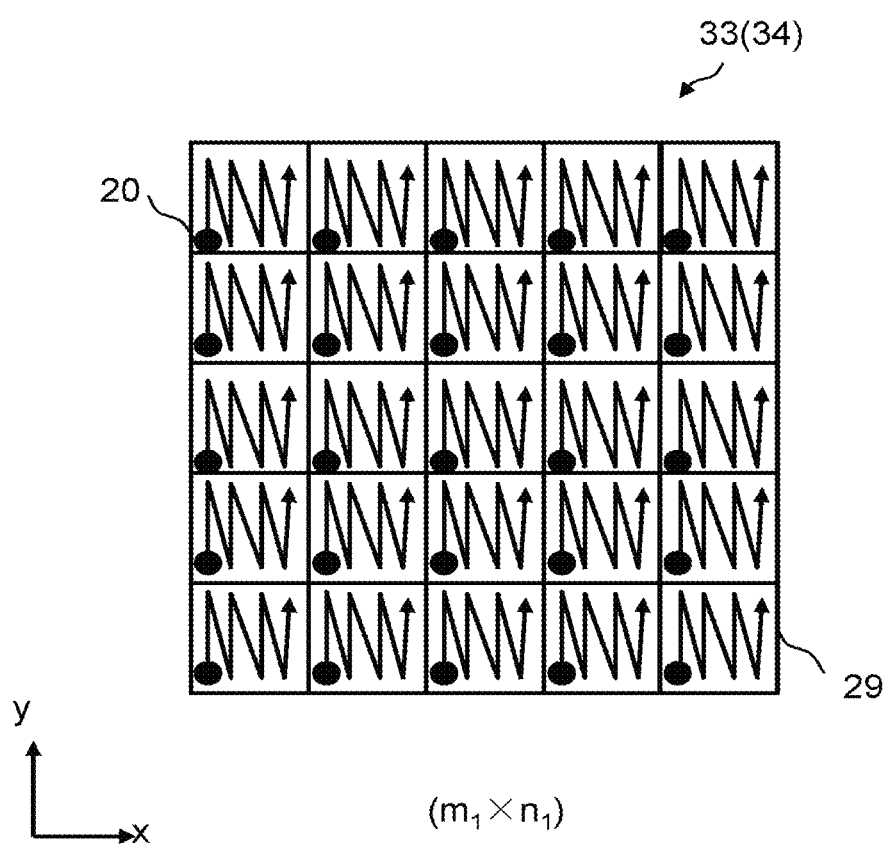
FIG. 14 illustrates a scanning operation with multiple beams according to the first embodiment.

FIG. 14 illustrates a scanning operation with multiple beams according to the first embodiment. In the example of FIG. 14, multiple beams 20 of 5×5 (rows by columns) are shown. The size of an irradiation region 34 that can be irradiated by one irradiation with the multiple beams 20 is defined by (x direction size obtained by multiplying a pitch between beams in the x direction of the multiple beams 20 on the substrate 101 by the number of beams in the x direction)×(y direction size obtained by multiplying a pitch between beams in the y direction of the multiple beams 20 on the substrate 101 by the number of beams in the y direction). In the case of FIG. 14, the irradiation region 34 and the mask die 33 are of the same size. However, it is not limited thereto. The irradiation region 34 may be smaller than the mask die 33, or larger than it. Each beam of the multiple beams 20 scans the inside of a sub-irradiation region 29 surrounded by the pitch between beams in the x direction and the pitch between beams in the y direction, where the beam concerned itself is located. Each beam of the multiple beams 20 is associated with anyone of the sub-irradiation regions 29 which are different from each other. At the time of each shot, each beam irradiates the same position in the associated sub-irradiation region 29. The beam is moved in the sub-irradiation region 29 by collective deflection of all the multiple beams 20 by the sub deflector 209. By repeating this operation, one beam irradiates all the pixels in order in one sub-irradiation region 29.

The multiple secondary electron beams 300 including reflected electrons, each corresponding to each of the multiple beams 20, are emitted from the substrate 101 because desired positions on the substrate 101 are irradiated with the multiple beams 20 whose aberration has been corrected by the aberration corrector 220. The multiple secondary electron beams 300 emitted from the substrate 101 travel to the beam separator 214, and are bent obliquely upward. Then, the trajectory of the multiple secondary electron beams 300 having been bent obliquely upward is bent by the deflector 218, and projected on the multi-detector 222. As described above, the multi-detector 222 detects the multiple secondary electron beams 300 emitted because the substrate 101 surface is irradiated with the multiple beams 20. Reflected electrons may be emitted in the middle of the optical path.

Thus, the whole of the multiple beams 20 scans the mask die 33 as the irradiation region 34, and that is, each beam individually scans one corresponding sub-irradiation region 29. Then, after scanning one mask die 33, the irradiation region 34 is moved to a next adjacent mask die 33 so as to be scanned. This operation is repeated to proceed with scanning of each chip 332. Due to shots of the multiple beams 20, secondary electrons are emitted from the irradiated positions at each shot time, and detected by the multi-detector 222.

As described above, using the multiple beams 20, the image acquisition mechanism 150 scans the substrate 101 to be inspected on which a figure pattern has been formed, and detects the multiple secondary electron beams 300 emitted from the inspection substrate 101 by irradiation with the multiple beams 20 onto the inspection substrate 101. Detected data (measured image: secondary electron image: inspection image) on a secondary electron from each measurement pixel 36 detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, together with information data on each position from the position circuit 107.

In a reference image generating step, the reference image generation circuit 112 (reference image generation unit) generates a reference image corresponding to an inspection image to be inspected. The reference image generation circuit 112 generates a reference image, for each frame region, based on design data serving as a basis for forming a pattern on the substrate 101, or on design pattern data defined in exposure image data of a pattern formed on the substrate 101. Preferably, for example, the mask die 33 is used as the frame region. Specifically, it operates as follows: First, design pattern data is read from the storage device 109 through the control computer 110, and each figure pattern defined in the read design pattern data is converted into image data of binary or multiple values.

Here, basics of figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as rectangles, triangles and the like.

When design pattern data used as the figure data is input to the reference image generation circuit 112, the data is developed into data of each figure. Then, with respect to each figure data, the figure code, the figure dimensions, and the like indicating the figure shape of each figure data are interpreted. The reference image generation circuit 112 develops each figure data to design pattern image data of binary or multiple values as a pattern to be arranged in squares in units of grids of predetermined quantization dimensions, and outputs the developed data. In other words, the reference image generation circuit 112 reads design data, calculates occupancy occupied by a figure in the design pattern, for each square region obtained by virtually dividing the inspection region into squares in units of predetermined dimensions, and outputs n-bit occupancy data. For example, it is preferable to set one square as one pixel. Assuming that one pixel has a resolution of $1/2^8(=1/256)$, the occupancy rate in each pixel is calculated by allocating small regions which correspond to the region of figures arranged in the pixel concerned and each of which corresponds to $1/256$ resolution. Then, 8-bit occupancy data is output to the reference image generation circuit 112. The square region (inspection pixel) should be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in an analog state continuously changing, it is possible to match/fit the design image data with the measured data by also applying filtering to the design image data being image data on the design side whose image intensity (gray scale level) is represented by digital values. The generated image data of a reference image is output to the comparison circuit 108.

Figure 15:
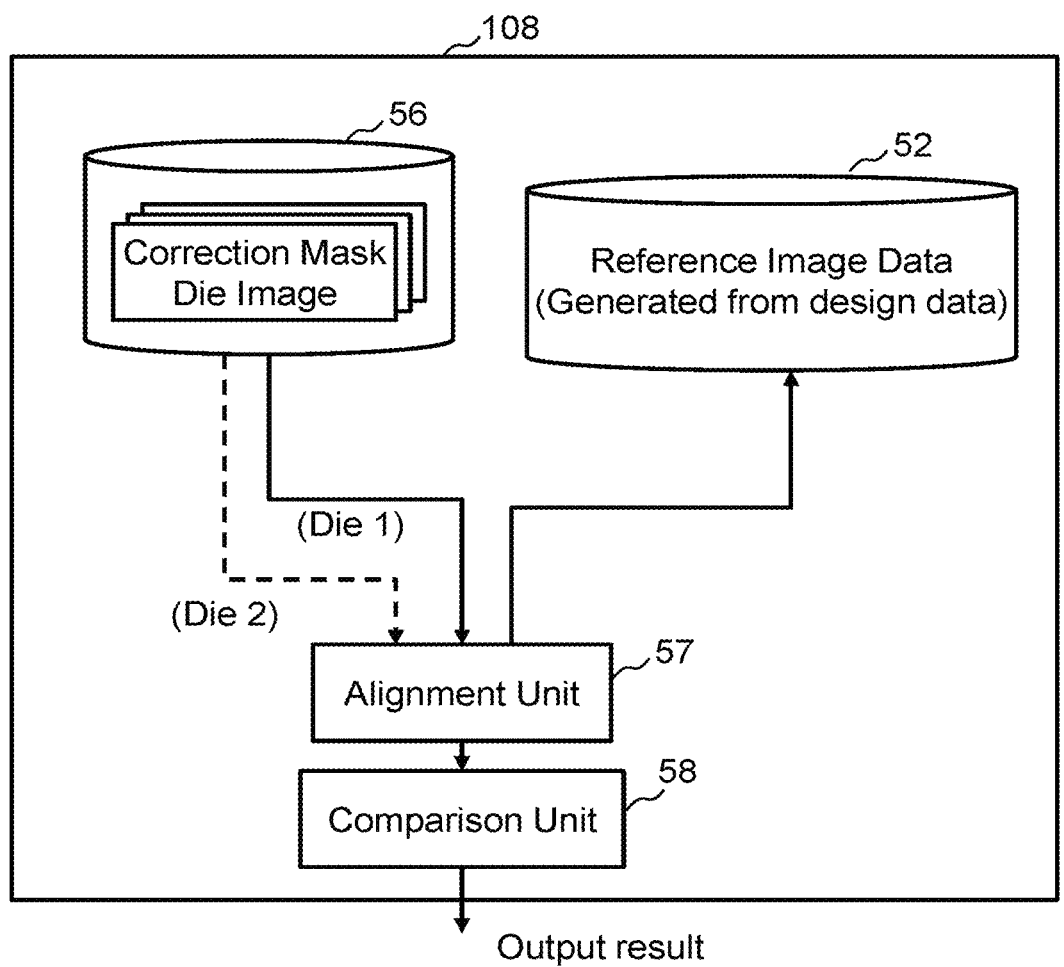
FIG. 15 shows an example of an internal configuration of a comparison circuit according to the first embodiment.

FIG. 15 shows an example of an internal configuration of a comparison circuit according to the first embodiment. In FIG. 15, storage devices 52 and 56, such as magnetic disk drives, an alignment unit 57, and a comparison unit 58 are arranged in the comparison circuit 108. Each of the "units" such as the alignment unit 57 and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the alignment unit 57 and the comparison unit 58, and calculated results are stored in a memory (not shown) or in the memory 118 each time.

In the comparison circuit 108, transmitted pattern image data (or secondary electron image data) is temporarily stored in the storage device 56. Moreover, transmitted reference image data is temporarily stored in the storage device 52.

In an aligning step, the alignment unit 57 reads a mask die image serving as an inspection image, and a reference image corresponding to the mask die image, and provides alignment between the images based on units of sub-pixels smaller than units of pixels 36. For example, the alignment can be performed by a least-square method.

In a comparing step, the comparison unit 58 compares the mask die image (inspection image) and the reference image concerned. The comparison unit 58 compares them, for each pixel 36, based on predetermined determination conditions in order to determine whether there is a defect such as a shape defect. For example, if a gray scale level difference in each pixel 36 is larger than a determination threshold Th, it is determined that there is a defect. Then, the comparison result is output, and specifically, is output to the storage device 109, the monitor 117, or the memory 118, or alternatively, output from the printer 119.

Although the die-to-database inspection is described above, the die-to-die inspection may also be performed. In the case of conducting the die-to-die inspection, images of the mask dies 33 with identical patterns formed thereon are compared. Accordingly, a mask die image of a partial region of the wafer die 332 serving as a die (1), and a mask die image of a corresponding region of another wafer die 332 serving as a die (2) are used. Alternatively, a mask die image of a partial region of the wafer die 332 serving as a die (1), and a mask die image of another partial region other than the above-mentioned partial region of the same wafer die 332 serving as a die (2), where identical patterns are formed, may be compared. In such a case, if one of the images of the mask dies 33 on which identical patterns are formed is used as a reference image, inspection can be performed by the same method as that of the die-to-database inspection described above.

That is, in the aligning step, the alignment unit 57 reads the mask die image of the die (1) and the mask die image of the die (2), and provides alignment between the images based on units of sub-pixels smaller than units of pixels 36. For example, the alignment can be performed by a least-square method.

Then, in the comparing step, the comparison unit 58 compares the mask die image of the die (1) and the mask die image of the die (2). The comparison unit 58 compares them, for each pixel 36, based on predetermined determination conditions in order to determine whether there is a defect such as a shape defect. For example, if a gray scale level difference in each pixel 36 is larger than the determination threshold Th, it is determined that there is a defect. Then, the comparison result is output, and specifically, is output to a storage device, monitor, or memory (which are not shown), or alternatively, is output from a printer.

As described above, according to the first embodiment, the thickness of each electrode 16 itself of multipole lenses arranged in an array for multiple electron beams can be made thin. Moreover, movement (travelling) of an electron between electrodes 16 for adjacent beams can be suppressed, and therefore, it is possible to suppress the influence of electric potential for an adjacent beam on each electric field. Thus, even if the pitch between beams is narrow, the aberration corrector 220 can achieve a sufficient performance.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a processor to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the stage control circuit 114, the aberration correction circuit 121, the lens control circuit 124, the blanking control circuit 126, and the deflection control circuit 128 may be configured by at least one processing circuit described above.

Embodiments have been explained referring to specific examples described above. However, the present invention is not limited to these specific examples. Although FIG. 1 describes the case where the multiple primary electron beams 20 are formed by the shaping aperture array substrate 203 irradiated with one beam from one irradiation source, namely, the electron gun 201, it is not limited thereto. The multiple primary electron beams 20 may be formed by individual irradiation with primary electron beams from a plurality of irradiation sources.

While the apparatus configuration, control method, and the like not directly necessary for explaining the present invention are not described, some or all of them can be appropriately selected and used on a case-by-case basis when needed.

In addition, any other aberration corrector and multiple electron beam irradiation apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An aberration corrector comprising:
a lower electrode substrate configured to be formed therein with a plurality of first passage holes which has a first hole diameter and through which multiple electron beams pass, and to be arranged thereon a plurality of electrode sets each being a plurality of electrodes of four poles or more than four poles, which surround a first passage hole of the plurality of the first passage holes, for each of the plurality of the first passage holes; and
an upper electrode substrate, arranged above the lower electrode substrate, configured to be formed therein with a plurality of second passage holes through which the multiple electron beams pass, whose size from a top surface of a body of the upper electrode substrate to a middle of a way to a back side of the upper electrode substrate is a second hole diameter, and whose size from the middle to the back side is a third hole diameter larger than the first hole diameter and larger than the second hole diameter, wherein a shield electrode is disposed on inner walls of the plurality of second passage holes, wherein
the upper electrode substrate is arranged such that a thickness of the upper electrode substrate at a portion where the plurality of second passage holes has the third hole diameter is larger than a size of the third hole diameter.

2. The aberration corrector according to claim 1, wherein a value obtained by dividing a distance which is between adjacent second passage holes of the plurality of second passage holes in the upper electrode substrate and is at a portion where each of the plurality of second passage holes has the third hole diameter by a gap between the lower electrode substrate and the upper electrode substrate is equal to or greater than a threshold.

3. The aberration corrector according to claim 1, wherein an insulating layer is formed between a body of the lower electrode substrate and the plurality of electrodes.

4. The aberration corrector according to claim 1, wherein the lower electrode substrate and the upper electrode substrate are arranged such that a thickness of the upper electrode substrate at a portion where the plurality of second passage holes has the third hole diameter is greater than a gap between the lower electrode substrate and the upper electrode substrate.

5. The aberration corrector according to claim 1, wherein the shield electrode is further disposed on a top surface, a side surface, and a bottom surface of the upper electrode substrate.

6. A multiple electron beam irradiation apparatus comprising:
an aberration corrector that corrects at least one of astigmatism and aberration distortion of multiple electron beams, the aberration corrector including a lower electrode substrate configured to be formed therein with a plurality of first passage holes which has a first hole diameter and through which multiple electron beams pass, and to be arranged thereon a plurality of electrode sets each being a plurality of electrodes of four poles or more than four poles which surround a first passage hole of the plurality of the first passage holes for each of the plurality of the first passage holes, and an upper electrode substrate, arranged above the lower electrode substrate, configured to be formed therein with a plurality of second passage holes through which the multiple electron beams pass, whose size from a top surface of the upper electrode substrate to a middle of a way to a back side of the upper electrode substrate is a second hole diameter, and whose size from the middle to the back side is a third hole diameter larger than the first hole diameter and larger than the second hole diameter, wherein a shield electrode is disposed on inner walls of the plurality of second passage holes; and an electron optical system that leads multiple electron beams, whose at least one of astigmatism and aberration distortion has been corrected by the aberration corrector, to a target object, wherein the upper electrode substrate is arranged such that a thickness of the upper electrode substrate at a portion where the plurality of second passage holes has the third hole diameter is larger than a size of the third hole diameter.

7. The apparatus according to claim 6, wherein a value obtained by dividing a distance which is between adjacent second passage holes of the plurality of second passage holes in the upper electrode substrate and is at a portion where each of the plurality of second passage holes has the third hole diameter by a gap between the lower electrode substrate and the upper electrode substrate is equal to or greater than a threshold.

8. The apparatus according to claim 6, wherein an insulating layer is formed between a body of the lower electrode substrate and the plurality of electrodes.

9. The apparatus according to claim 6, wherein the lower electrode substrate and the upper electrode substrate are arranged such that a thickness of the upper electrode substrate at a portion where the plurality of second passage holes has the third hole diameter is greater than a gap between the lower electrode substrate and the upper electrode substrate.

10. The apparatus according to claim 6, further comprising:
a shaping aperture array substrate that forms the multiple electron beams; and
a beam separator that separates multiple secondary electron beams, which are emitted because the target object is irradiated with the multiple electron beams, from the multiple electron beams,
wherein the aberration corrector is disposed between the shaping aperture array substrate and the beam separator.

11. The apparatus according to claim 6, wherein
the electron optical system includes an electromagnetic lens, and the aberration corrector is arranged in a magnetic field of the electromagnetic lens.

12. The aberration corrector according to claim 1, wherein
the upper electrode substrate includes a plurality of flange portions each arranged at an upper part of each of the plurality of second passage holes.

\* \* \* \* \*